(12) United States Patent
Smith et al.

(10) Patent No.: US 6,958,294 B2
(45) Date of Patent: Oct. 25, 2005

(54) METHOD FOR PHOTORESIST STRIP, SIDEWALL POLYMER REMOVAL AND PASSIVATION FOR ALUMINUM METALLIZATION

(75) Inventors: Patricia B. Smith, Colleyville, TX (US); Guoqiang Xing, Plano, TX (US); David B. Aldrich, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/457,653

(22) Filed: Jun. 9, 2003

(65) Prior Publication Data

US 2003/0203642 A1 Oct. 30, 2003

Related U.S. Application Data

(60) Division of application No. 10/082,759, filed on Feb. 25, 2002, now Pat. No. 6,599,829, which is a continuation-in-part of application No. 09/199,600, filed on Nov. 25, 1998, now abandoned.

(51) Int. Cl.[7] .......................................... H01L 21/4763
(52) U.S. Cl. ........................ 438/683; 438/636; 438/637
(58) Field of Search ................................. 438/683, 636, 438/637, 694, 643, 653, 200, 192, 622, 631, 633, 640, 618, 619, 620, 623, 621, 710, 725, 329, 330

(56) References Cited

U.S. PATENT DOCUMENTS

| | | | |
|---|---|---|---|
| 4,370,195 A | | 1/1983 | Halon et al. |
| 4,782,008 A | | 11/1988 | Babich et al. |
| 4,981,909 A | | 1/1991 | Babich et al. |
| 4,983,254 A | | 1/1991 | Fujimura et al. |
| 5,079,600 A | | 1/1992 | Schnur et al. |
| 5,660,682 A | | 8/1997 | Zhao et al. |
| 5,792,672 A | * | 8/1998 | Chan et al. ................. 438/622 |
| 5,811,358 A | | 9/1998 | Tseng et al. |
| 5,858,869 A | | 1/1999 | Chen et al. |
| 5,914,150 A | | 6/1999 | Porter et al. |
| 6,013,574 A | | 1/2000 | Hause et al. |
| 6,033,990 A | * | 3/2000 | Kishimoto et al. ......... 438/710 |
| 6,046,115 A | * | 4/2000 | Molloy et al. .............. 438/710 |
| 6,271,115 B1 | * | 8/2001 | Liu et al. .................... 438/618 |
| 6,599,829 B2 | * | 7/2003 | Smith et al. ................ 438/636 |

* cited by examiner

*Primary Examiner*—Laura M Schillinger
(74) *Attorney, Agent, or Firm*—Peter K. McLarty; W. James Brady, III; Frederick J. Telecky, Jr.

(57) ABSTRACT

An embodiment of the instant invention is a method of fabricating an electronic device formed on a semiconductor wafer, the method comprising the steps of: forming a layer of a first material (layer 622 of FIG. 6a) over the substrate; forming a photoresist layer (layer 626 of FIG. 6b) over the layer of the first material; patterning the layer of the first material; removing the photoresist layer after patterning the layer of the first material; and subjecting the semiconductor wafer to a plasma which incorporates a gas which includes hydrogen or deuterium so as to remove residue from the first material. Preferably, the step of removing the photoresist layer is performed by subjecting the semiconductor wafer to the plasma which incorporates a gas which substantially includes hydrogen or deuterium. The gas which includes hydrogen or deuterium is, preferably, comprised of a gas selected from the group consisting of: $NH_3$, $N_2H_2$, $H_2S$, $CH_4$, and deuterated forms of these gases, and may, additionally, include a forming gas. The forming gas is, preferably, comprised of a gas consisting of: argon, nitrogen, and any other inert gas.

5 Claims, 9 Drawing Sheets

METHOD FOR PHOTORESIST STRIP, SIDEWALL POLYMER REMOVAL AND PASSIVATION FOR ALUMINUM METALLIZATION

CROSS-REFERENCE TO RELATED PATENT/PATENT APPLICATIONS

This application is a divisional of application Ser. No. 10/082,759, filed Feb. 25, 2002 now U.S. Pat. No. 6,599,829, which is a continuation-in-part of prior application Ser. No. 09/199,600 filed Nov. 25, 1998 now abandoned. The following commonly assigned patent/patent applications are hereby incorporated herein by reference:

| Pat. No. /Ser. No. | Filing Date | TI Case No. |
|---|---|---|
| 09/199,829 | Nov. 25, 1998 | TI-25250 |

FIELD OF THE INVENTION

The instant invention pertains to semiconductor device fabrication and processing and more specifically to post metal pattern, dielectric etch, photoresist strip and residue removal processing.

BACKGROUND OF THE INVENTION

Most semiconductor devices utilize several different levels of metallization. With the increasing complexity of devices and the need to reduce the physical size of devices, the number of levels which incorporate metal connections is increasing. In addition, with the desire to increase the speed of the devices while reducing the power consumed by the devices, advanced metallization schemes are being developed. One such scheme involves the use of copper-doped aluminum or copper structures for the bus lines and interconnects. Additionally, interlevel dielectrics with lower dielectric constants than standard silicon dioxide films may be used as the dielectric material situated between metallic structures.

A problem that most semiconductor manufacturers face is the cleaning up of the metallic structures after the structures are patterned and etched. More specifically, the photoresist needs to be removed, and the residual metal halide etch byproducts have to be removed or converted to different chemical forms to avoid corrosion of the metal. These processes, commonly known as photoresist strip and passivation processes, may cause non-conducting residues to form on the metallic structure. In order to address this problem, a cleaning step is typically performed after the metal structure is exposed and the photoresist is removed. The cleanup step will preferably remove all of the residue, typically comprised of inorganic polymers, that are formed on the metal structure, thus inhibiting corrosion of the metal structures. However, the clean step must not appreciably affect the electrical critical dimension (CD) of the metal structure.

Typically, for a metallization scheme consisting primarily of Al, the cleanup process consists of an HF vapor etch and an optional solvent clean. More specifically, an $O_2/H_2O$ plasma photoresist strip and metal passivation step is performed followed by an ex situ HF vapor etch and solvent cleanup. The use of the separate HF vapor treatment equipment and the subsequent solvent "wet" clean increases processing costs and reduces production throughput. The use of a solvent is additionally undesirable due to environmental issues. Solvent recycling further increases the cost of the traditional cleanup process. In addition, both the HF vapor and solvent clean can cause CD loss, and may undercut the TiN/Ti barrier layers between the conductor and the dielectric substrate. Such cleanup processes may not sufficiently passivate the aluminum conductors, thereby resulting in the corrosion of the structure. Hence, a dry process which is environmentally friendly and which passivates the metal structure would be preferable. The use of an $O_2/H_2O$ plasma passivation and photoresist strip step followed by an in situ $O_2/CF_4$ or $H_2O/CF_4$ plasma clean step to remove the polymer residue from the metal structure has been used. However, the fluorine plasma may erode the process equipment in which this step is performed (e.g. any quartz parts in the process chamber would be eroded by the fluorine containing plasma).

For a typical Cu metallization scheme, a standard $O_2$ plasma ash is performed to remove photoresist after a via etch process. Ashing with $O_2$ causes substantial oxidation to any exposed Cu at the bottom of the via. Therefore, a $Si_3N_4$ barrier layer is typically deposited to prevent Cu oxidation. Dielectric etch and photoresist removal are then completed with no exposed Cu. The nitride barrier layer must then be removed in a separate wet or dry etch process. Thus, a dry plasma etch process which could be used to remove photoresist without oxidation of Cu would simplify the process flow by either eliminating the need for the $Si_3N_4$ barrier layer, or substantially thinning it (it might still be useful as an etch stop layer for via formation). Removal or thinning of the $Si_3N_4$ barrier layer would ease the oxide etch selectivity requirements since stopping the etch on $Si_3N_4$ would not be necessary.

SUMMARY OF THE INVENTION

An embodiment of the instant invention is a hydrogen-containing plasma processing step to be used after the metal structure is etched. This novel step will passivate most metal structures, remove the polymeric residue from the sidewalls of the metal structures, and will remove the photoresist. In addition, this novel step has the following advantages over the prior art methods: it is a higher throughput process, it can be done in situ in any resist strip equipment regardless of the plasma energy source (e.g. a downstream microwave plasma source or a conventional RF plasma source), it provides better passivation of the exposed metal pattern by converting the metal halide residues into volatile hydrogen halides, it does not appreciably oxidize the exposed Cu and therefore may be used in structures without Cu barrier layers present, it does not produce hazardous waste, and it does not corrode the processing equipment.

An embodiment of the instant invention is a method of fabricating an electronic device formed on a semiconductor wafer, the method comprising the steps of: forming a layer of a first material over the substrate; forming a photoresist layer over the layer of the first material; patterning the layer of the first material; removing the photoresist layer after patterning the layer of the first material; and subjecting the semiconductor wafer to a plasma which incorporates a gas which includes hydrogen or deuterium so as to remove residue from the first material. Preferably, the step of removing the photoresist layer is performed by subjecting the semiconductor wafer to the plasma which incorporates a gas which substantially includes hydrogen or deuterium. The gas which includes hydrogen or deuterium is, preferably, comprised of a gas selected from the group consisting of: $NH_3$, $N_2H_2$, $H_2S$, $CH_4$, and deuterated forms of these gases, and may, additionally, include a forming gas. The forming gas is, preferably, comprised of a gas consisting of: argon, nitrogen, and any other inert gas.

The electronic device is, preferably, selected from the group consisting of: a memory device, a DRAM device, a logic device, a processor, a DSP, a microprocessor, and any combination thereof. Preferably, the first material is comprised of a conductive material which is not substantially sensitive to oxygen. More specifically, first material is, preferably, comprised of aluminum.

The step of subjecting the semiconductor wafer to the plasma which incorporates the gas which includes hydrogen or deuterium passivates the patterned layer of the first material.

Another embodiment of the instant invention is a method of forming a conductive feature comprised of a material which is not substantially sensitive to oxygen over a semiconductor substrate for an electronic device, the method comprising the steps of: forming a conductive layer over the semiconductor substrate, the conductive layer comprised of the material which is not substantially sensitive to oxygen; forming a photoresist layer over the conductive layer, the photoresist having a pattern so as to expose portions of the conductive layer; removing the exposed portions of the conductive layer so as to form the conductive structure; and subjecting the semiconductor wafer to a plasma which incorporates a gas which includes hydrogen or deuterium to remove photoresist from the material. Preferably, the material which is not substantially sensitive to oxygen is comprised of aluminum, and the gas is comprised of a gas selected from the group consisting of: $H_2$, $D_2$, $NH_3$, $N_2H_2$, $H_2S$, $CH_4$, and deuterated forms of these gases. Preferably, any residue formed on exposed portions of the conductive feature are removed during the step of subjecting the semiconductor wafer to a plasma which incorporates a gas which includes hydrogen or deuterium. The step of subjecting the semiconductor wafer to a plasma which incorporates a gas which includes hydrogen or deuterium, preferably, passivates the conductive structure.

Another embodiment of the instant invention is a method of forming an interconnecting conductive structure comprised of a conductive material which is not substantially sensitive to oxygen over a semiconductor substrate, the method comprising the steps of: forming a first conductive structure over the semiconductor substrate; forming a dielectric layer over the substrate and the first conductive structure; forming a photoresist layer over the dielectric layer, the photoresist layer having a pattern so as to expose a portion of the dielectric layer which overlays a portion of the first conductive structure; removing the exposed portion of the dielectric layer so as to form an opening in the dielectric layer which exposes a portion of the first conductive structure; subjecting the exposed portion of the first conductive structure to a plasma which incorporates a gas which includes hydrogen or deuterium so as to remove residue formed on the exposed portion of the first conductive structure; forming a conductive material over the dielectric layer and within the opening in the dielectric layer, the conductive material making an electrical contact with the first conductive structure; and removing portions of the conductive material over the dielectric layer so as to form the interconnecting conductive structure. Preferably, the step of subjecting the exposed portion of the first conductive structure to a plasma which incorporates a gas which includes hydrogen or deuterium removes the photoresist layer, and/or it passivates the exposed portion of the first conductive structure. The interconnecting conductive structure is, preferably, comprised of aluminum, and the first conductive structure is comprised of material which is substantially the same as the interconnecting conductive structure. The gas is, preferably, comprised of a gas selected from the group consisting of: $H_2$, $D_2$, $NH_3$, $N_2H_2$, $H_2S$, $CH_4$, and deuterated forms of these gases.

DETAILED DESCRIPTION OF THE INVENTION

While the methods of the instant invention are described with reference to FIGS. 1–6, the methods of the instant invention can be applied to any type of device structure (e.g. metal interconnects, metal lines, metal gates, or other conductive structures) and to any type of device (e.g. memory devices, logic devices, power devices, DSPs, or microprocessors). In addition, the method of the instant invention can be used to remove residue and/or photoresist from other device structures. Furthermore, while the methods of the instant invention, as described below, revolve around the use of hydrogen plasma, other plasmas may be used (such as a deuterium plasma, or other hydrogen-containing plasmas, such as $NH_3$, $N_2H_2$, $H_2S$, $CH_4$, and deuterated forms of these gases, for example).

The following method of one embodiment of the instant invention should preferably be used in a process flow where there are exposed portions of oxygen-sensitive conductive structures.

Figure 1:
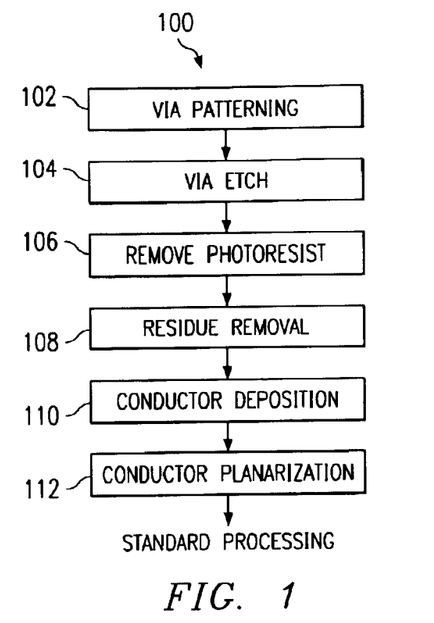
FIG. 1 is a flow diagram illustrating the method of one embodiment of the instant invention. This method is preferably utilized in a damascene process flow where oxygen-sensitive metal is exposed (preferably during the via etch process).
Figure 2A:
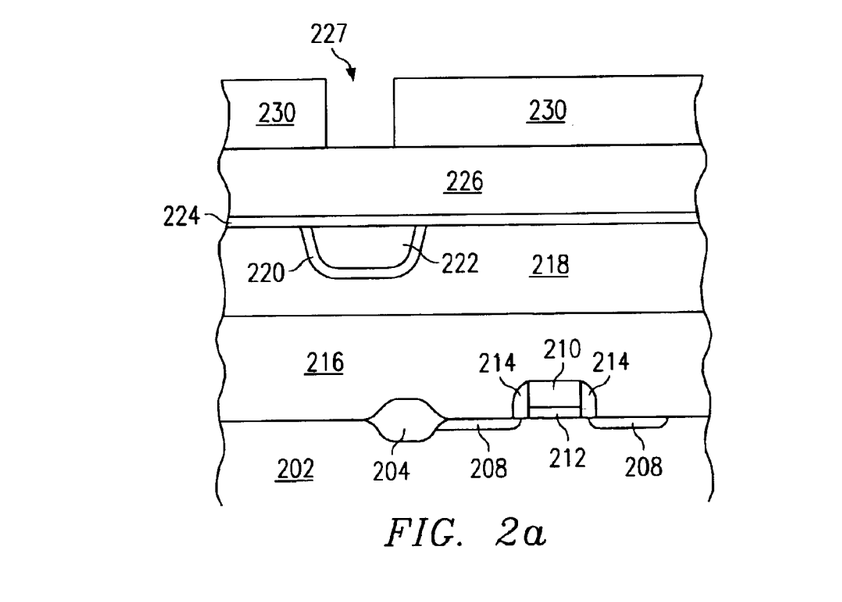
FIGS. 2a–2e are cross-sectional views of a semiconductor device which is fabricated using the method of the instant invention (which is illustrated in FIG. 1). This damascene flow is preferably utilized when oxygen sensitive metal is exposed during the via etch process.

Referring to FIG. 1 and FIG. 2a, after providing substrate 202, isolation region 204 (which could be formed using LOCOS, field oxidation, or shallow trench isolation techniques), source/drain regions 208, gate dielectric 212, conductive gate structure 210, sidewall insulators 214, dielectric layer 216 (preferably comprised of BPSG, PSG, silicon oxide, oxide/nitride stack, TEOS, a low dielectric constant material, or any other interlevel dielectric material—in fact, regions 216 and 218 can be one layer), liner/barrier layer 220 (preferably comprised of Ti, TiN, or a Ti/TiN stack), conductor 222 (preferably comprised of aluminum, copper, copper-doped aluminum, or any other refractory metal), barrier layer 224 (preferably comprised of silicon nitride), dielectric layer 226 (preferably comprised of BPSG, PSG, TEOS, aerogel, xerogel, HSQ or any other low dielectric constant material), photoresist layer 230 is formed and patterned (step 102) over dielectric layer 226. Preferably, dielectric layer 226 is comprised of an oxide, an oxide/nitride stack, BPSG, PSG, TEOS, or a low dielectric constant material, such as aerogel, xerogel, HSQ, or a polymer. Opening 227 in photoresist 230 is preferably aligned with underlying metal structure 222, which may be surrounded by liner/barriers 220 and 224 (in the case of Cu metallization for example, when the metal is oxygen sensitive). Preferably, conductive structure 222 is a conductive line which is connected to other lines by interconnects and/or vias. Conductive structure 222 (for the damascene structure) is preferably comprised of copper or copper-doped aluminum (preferably on the order of 0.5 to 2.5 wt % of copper in aluminum. Liner/barriers 220 and 224 are comprised of titanium, titanium nitride, a Ti/TiN stack or other barrier-like material which adheres well to copper, aluminum and the interlevel dielectric material 218. Liner/barriers 220 and 224 may be comprised of the same material(s), but they do not have to be.

Figure 2B:
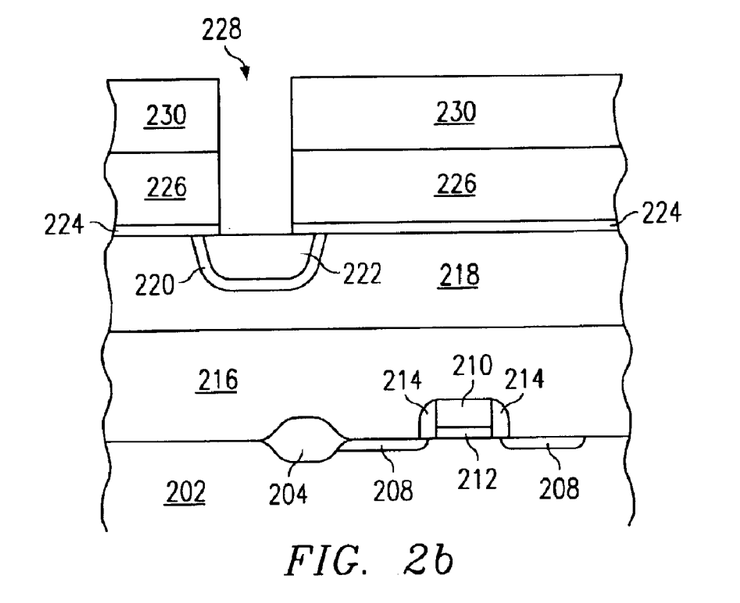

Referring to step 104 of FIG. 1 and FIG. 2b, an opening 228 is formed in dielectric 226 and liner/barrier layer 224 so as to expose at least a portion of conductor 222. Preferably, this is accomplished by subjecting the semiconductor wafer to $CF_4$, $CHF_3$, or other fluorinated compound plasma environment.

Figure 2C:
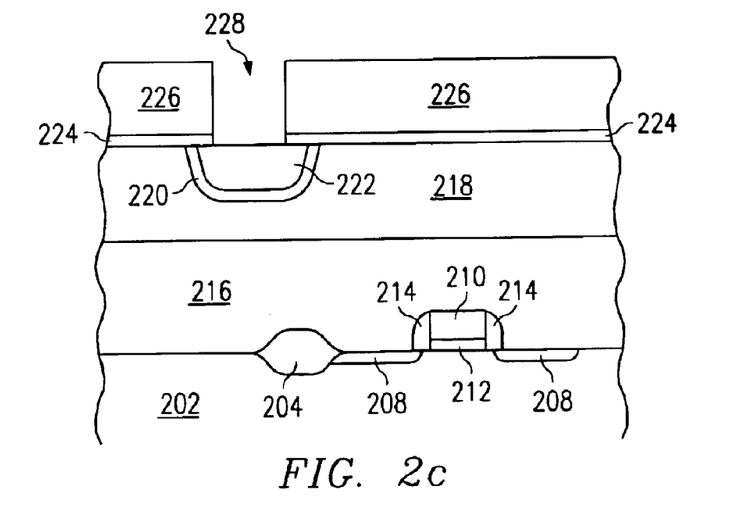

Referring to steps 106 and 108 of FIG. 1 and FIG. 2c, in order to remove photoresist layer 230, passivate the exposed portion of conductor 222, and clean any polymer layers off of the exposed portions of conductor 222, the method of the instant invention is utilized. Using the method of the instant invention, photoresist 230 can be removed at the same time that the clean and passivation steps are performed. Preferably, in step 106 the photoresist is removed by subjecting the wafer to a photoresist removal step which uses a remote (or downstream) plasma and substantially no oxidizing chemical component. Hence, using the instant invention, the photoresist can be removed by subjecting it to a hydrogen-containing (with or without the addition of argon or nitrogen) or deuterium-containing photoresist removal process which uses a remote or downstream plasma. This may be followed by additional processing which includes subjecting the wafer to another hydrogen-containing etch process which preferably uses a remote or downstream plasma so as to remove any residue. Both of these process steps can be accomplished in Mattson, Applied Materials ASP, GaSonics International, or Fusion ashers or other similar processing tools. An important limitation of the instant invention is that no external bias voltage other than zero volts be applied to the wafer during the processes. Therefore no external voltage should be applied to the wafer (other than zero volts) and/or the wafer can be connected to an electrical ground or left floating. The hydrogen could be introduced with a forming gas such as $N_2$ or Ar (where the hydrogen is 60 to 100% of the mixture) and/or deuterium may be used instead of hydrogen. If conductor 222 contains copper or other oxygen-sensitive material, and the barrier layer 224 has been removed, it is important that step 108 not contain any appreciable amount of oxygen. However, step 106 may be accomplished in an oxygen-containing ambient (such as an ash step in an oxygen ambient with a downstream or remote plasma) so long as the barrier layer 224 has not yet been removed, or if the barrier layer 224 has been removed, an oxygen ash step may be done if it is followed by a hydrogen-based passivation step 108.

Preferably, the aforementioned process is performed in an ash tool which is provided with a plasma which is generated remotely from the wafer, such as with the Applied Materials ASP asher. The processing conditions are preferably around: 1 to 6 Torr (preferably around 2 to 4 Torr) ambient pressure; flow rates of 2500–4500 $cm^3$/min; and an ambient temperature around 150 to 350° C. (preferably around 245° C. for the passivation step. For photoresist removal, the temperature may be 245–350° C. for achieving the most efficient photoresist removal rates.

In an alternative embodiment, the photoresist is removed during the hydrogen plasma step which utilizes a remotely generated plasma. Hence, steps 106 and 108 are combined in this embodiment. If conductor 222 contains copper or any other oxygen-sensitive compound, this unified step should, preferably, not contain an appreciable amount of oxygen.

In order to get a higher removal rate of the photoresist using the hydrogen or deuterium-containing remote plasma process, the energy of the plasma may be increased or the ambient temperature may be increased (preferably to around 245° C. to 350° C.; more preferably to around 245 to 250° C.). While the higher temperature is preferable during the removal of the photoresist, it is not necessary during the subsequent clean step. However, the higher temperature is preferably used during the subsequent clean step (step 108) since it is inefficient to heat the process chamber and then cool it down for the subsequent step.

Figure 2D:
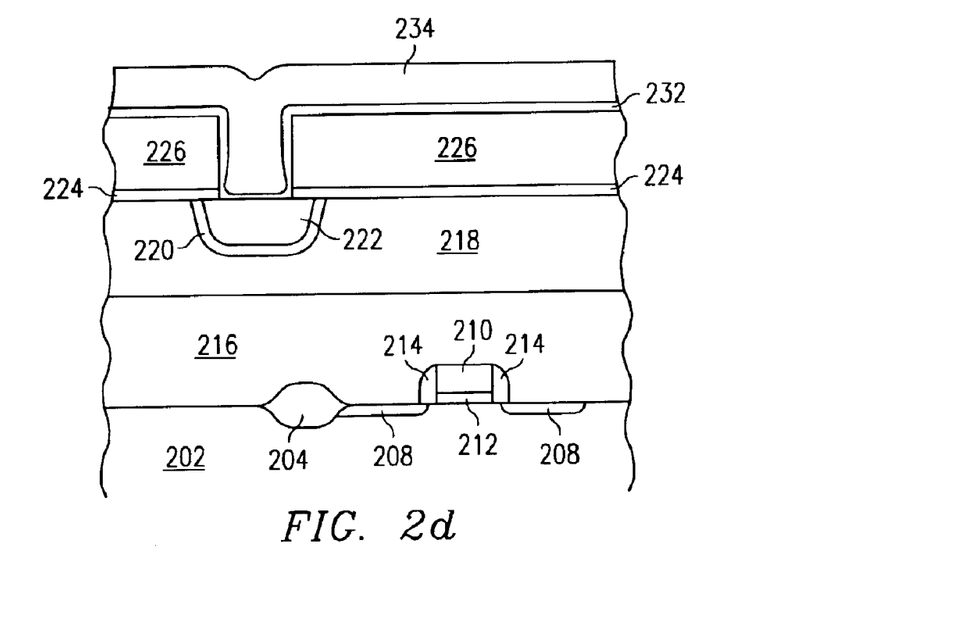

Referring to step 110 of FIG. 1 and FIG. 2d, liner/barrier 232 is preferably formed by chemical (CVD) or physical vapor deposition (PVD) on dielectric layer 226 and on the exposed portions of 222 (which should be free from any oxidation and residue due to step 108). Preferably, liner/barrier 232 is comprised of a material which will act as a barrier, will adhere to dielectric layer 226, will act as an adhesion layer for conductor 234, and which is electrically conductive (more preferably liner/barrier 232 is comprised of Ti, TiN, or a Ti/TiN stack). Next, conductor 234 is formed, preferably by electroplating or PVD. Conductor 234 is preferably comprised of aluminum, copper doped aluminum, copper, or other conductor or refractory metal.

Figure 2E:
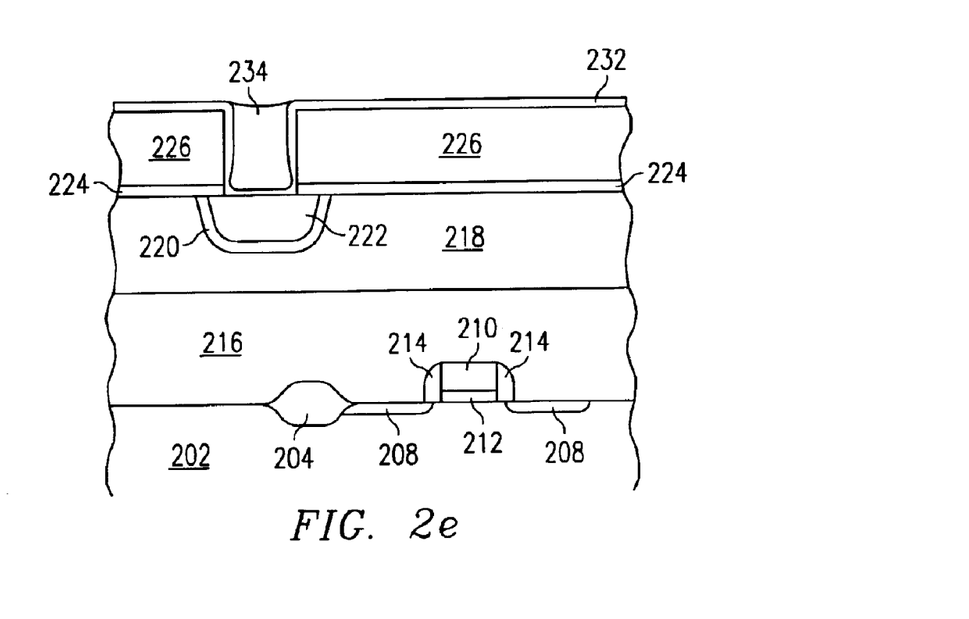

Referring to step 112 of FIG. 1 and FIG. 2e, conductor 234 is planarized so as to form interconnect 234. Preferably, the planarization is accomplished by chemical-mechanical polishing (CMP) or a blanket etch-back process. Liner/barrier 232 may remain intact (as is shown in FIG. 2e), or the portions of liner/barrier 232 above dielectric 226 may be removed. This may be done during the planarization step or it may be done separately. Further processing can be performed using standard device processing techniques which would be obvious to one of ordinary skill in the art.

Figure 3:
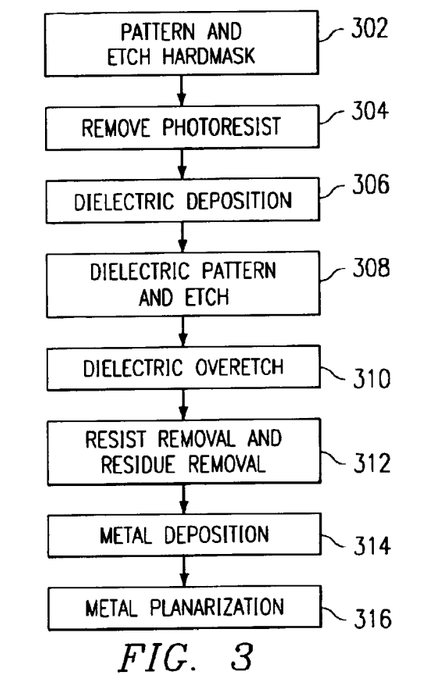
FIG. 3 is a flow diagram illustrating the method of another embodiment of the instant invention. This method is preferably utilized in a dual damascene process flow where oxygen-sensitive structures are exposed (preferably during the via etch process).
Figure 4A:
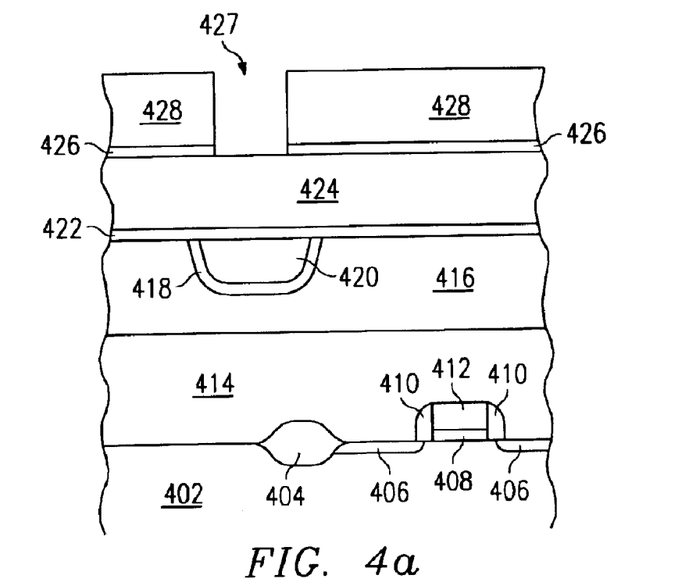
FIGS. 4a–4h are cross-sectional views of a semiconductor device which is fabricated using the method of the instant invention (which is illustrated in FIG. 3), incorporated into a dual damascene process flow where oxygen sensitive metal is exposed (preferably during the via etch process).

Referring to step 302 of FIG. 3 and FIG. 4a, after providing substrate 402, isolation region 404 (which could be formed using LOCOS, field oxidation, or shallow trench isolation techniques), source/drain regions 406, gate dielectric 408, conductive gate structure 412, sidewall insulators 410, dielectric layer 414 (preferably comprised of BPSG, PSG, silicon oxide, oxide/nitride stack, TEOS, a low dielectric constant material, or any other interlevel dielectric material—in fact, regions 414 and 416 can be one layer)

liner/barrier layer 418 (preferably comprised of Ti, TiN, or a Ti/TiN stack), conductor 420 (preferably comprised of aluminum, copper, copper-doped aluminum, or any other refractory metal), barrier layer 422 (preferably comprised of silicon nitride), dielectric layer 424 (preferably comprised of BPSG, PSG, TEOS, aerogel, xerogel, HSQ or any other low dielectric constant material), photoresist layer 428 is formed and patterned over hardmask layer 426. Preferably, hardmask layer 426 is comprised of an oxide, an oxide/nitride stack, or silicon nitride (most preferably, it is comprised of a nitride). Using the photoresist as a mask, hardmask 426 is etched so as to create opening 427 in the hardmask. Opening 427 is preferably aligned with underlying metal structure 420.

Figure 4B:
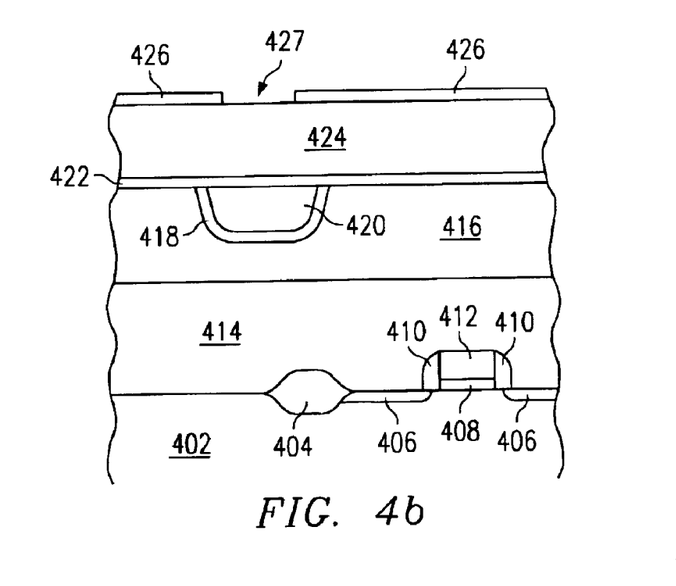

Referring to step 304 of FIG. 3 and FIG. 4b, photoresist 428 is removed. This may be accomplished by using a traditional oxygen ash step followed by a clean-up step, or the method of one embodiment of the instant invention can be used. Using the method of the instant invention, the wafer is subjected to a hydrogen-containing plasma so as to remove the photoresist and any residue. Preferably, the wafer temperature during this step is on the order of 150 to 350° C. (more preferably around 240 to 250° C.). While a hydrogen plasma is preferable, one or more forming gases (such as $N_2$ or Ar) can be added and/or deuterium or other hydrogen-containing gases such as $NH_3$, $N_2H_2$, $H_2S$, $CH_4$, or deuterated forms of these gases may be used instead of hydrogen. A subsequent clean-up step can be performed but it is not necessary.

Figure 4C:
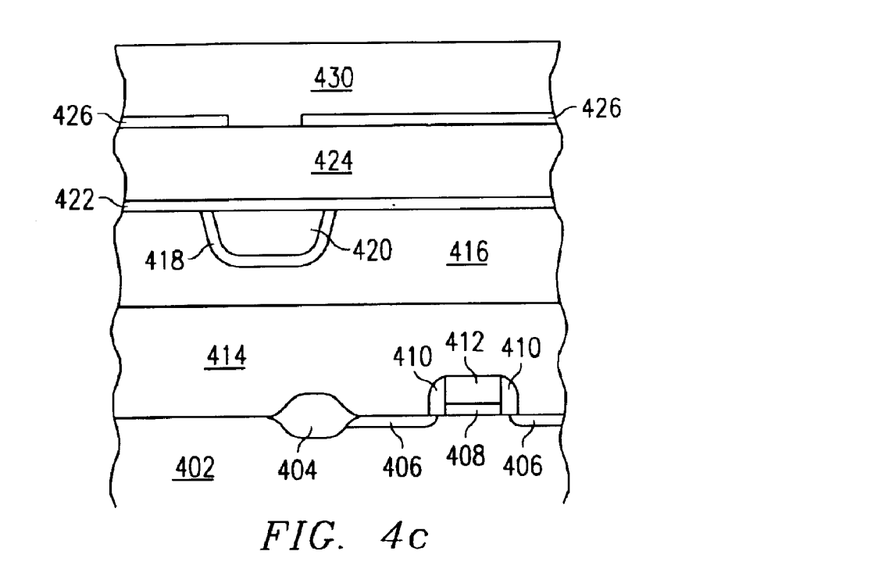

Referring to step 306 of FIG. 3 and FIG. 4c, a dielectric material is formed on hardmask 426. Preferably, dielectric layer 430 is comprised of TEOS, BPSG, PSG, HSQ, or a low dielectric constant material, such as aerogel, xerogel, or a polymer (such as fluorinated parylene). Dielectric layer 430 is preferably either spun on or deposited using chemical vapor deposition (CVD).

Figure 4D:
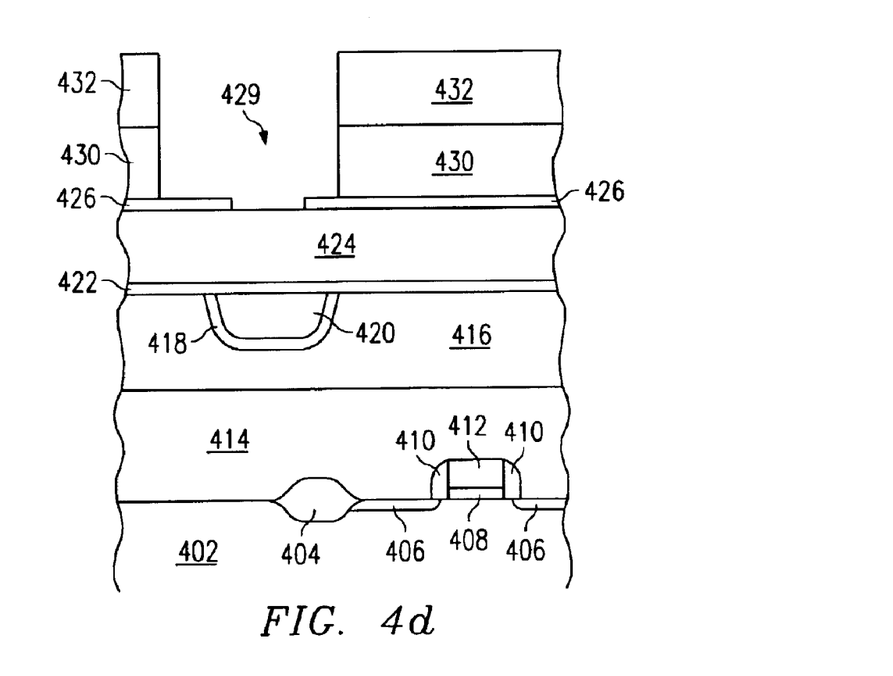
Figure 4E:
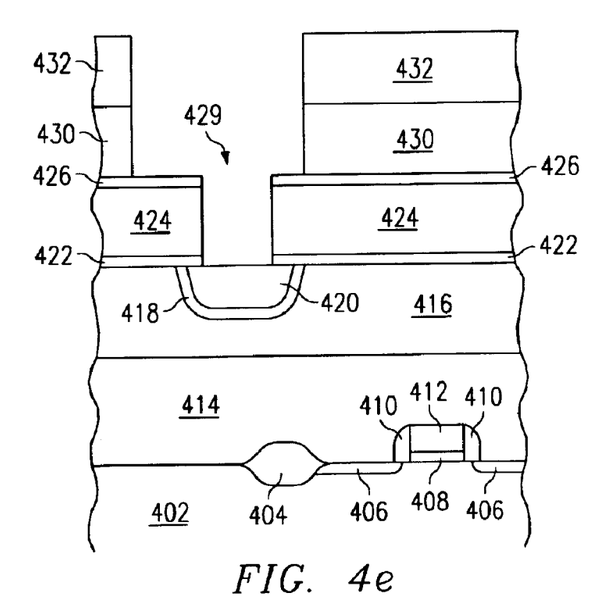

Referring to step 308 of FIG. 3 and FIG. 4d, photoresist layer 432 is formed with a pattern. This is followed by an etch process to remove the exposed portions of dielectric layers 430 and 424, and create via opening 429. Preferably, this etch process is an anisotropic process, and, more preferably, it is performed using $CHF_3$, $CF_4$ or other fluorinated hydrocarbon plasma chemistry. Referring to step 310 of FIG. 3 and FIG. 4e, an overetch process is performed to ensure completion of the dielectric etch. The barrier layer 422 is then removed (using a fluorine-based plasma chemistry to remove $Si_3N_4$, for example) to expose the metal (Cu) layer 420.

Figure 4F:
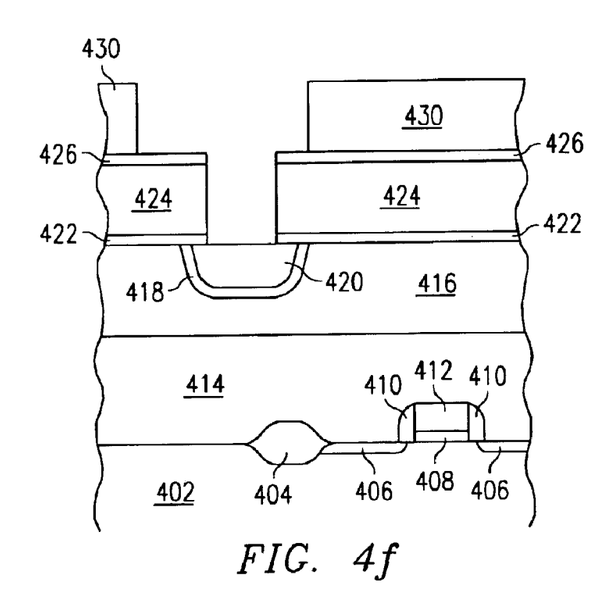

Referring to step 312 of FIG. 1 and FIG. 4f, photoresist 432 is removed. This may be accomplished by using a traditional oxygen ash step followed by a clean-up step, or the method of one embodiment of the instant invention can be used. The traditional oxygen ash step should not be performed if the exposed metal structure is comprised of a material that is oxygen sensitive (such as copper or copper doped aluminum). If a traditional photoresist removal step is performed, a subsequent clean-up step must be performed. The preferable clean-up step would include the method of the instant invention. More specifically, the wafer would be subjected to a hydrogen or deuterium containing plasma (which may also contain a forming gas such as $N_2$ or Ar) at a wafer temperature around 150 to 350° C. This clean-up step of the instant invention will remove any hydrocarbon residue left on metal structure 420 and will passivate metal structure 420.

Using the method of the instant invention to remove the photoresist, the wafer is subjected to a hydrogen-containing plasma so as to remove the photoresist and any residue resulting from the reaction of the anisotropic oxide etch chemistry with the photoresist layer. Preferably, the wafer temperature during this step is on the order of 150 to 350° C. (more preferably around 240 to 250° C.). While a hydrogen plasma is preferable, one or more forming gases (such as $N_2$ or Ar) can be added and/or deuterium or other hydrogen-containing plasmas, such as $NH_3$, $N_2H_2$, $H_2S$, $CH_4$, or deuterated forms of these gases for example, may be used instead of hydrogen. A subsequent clean-up step can be performed but it is not necessary. The photoresist removal step may be followed by another hydrogen or deuterium step to further clean any residue left on exposed metal structure 420 and to passivate metal structure 420. This step is optional, since both of these advantages will be accomplished, to some extent, during the photoresist strip step of the aforementioned embodiment of the instant invention.

Figure 4G:
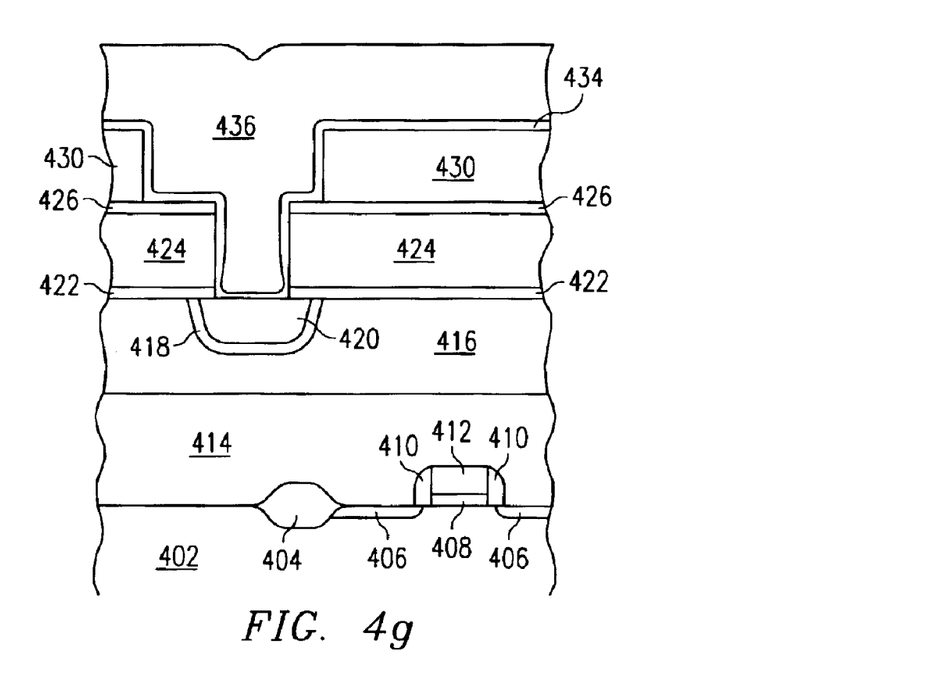

Referring to step 314 of FIG. 3 and FIG. 4g, a metal or other conductive material is formed over the liner 434. Liner layer 434 is preferably comprised of Ti, TiN, or a Ti/TiN stack. Preferably, metal layer 436 is comprised of aluminum, copper, copper-doped aluminum (preferably on the order of 0.5 to 5%; more, preferably on the order of 1 to 2%), or any other refractory metal. Metal layer 436 is preferably formed by electroplating, PVD or CVD or a combination thereof.

Figure 4H:
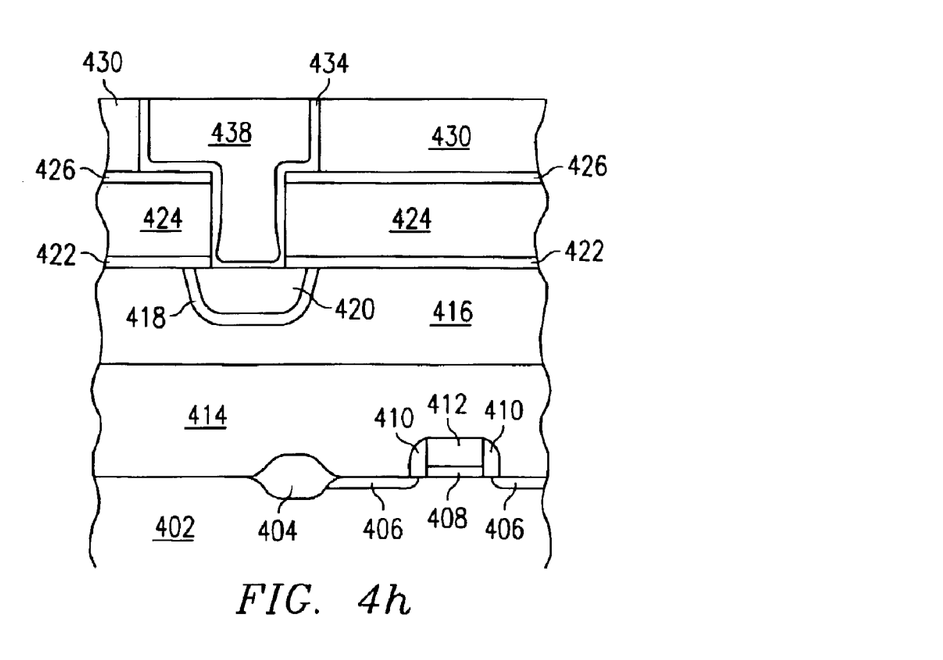

Referring to step 316 of FIG. 3 and FIG. 4h, metal structure 436 is planarized so as to form via and conductive line 438. Preferably, this planarization step is accomplished by CMP or a blanket etch-back step. The portion of liner/barrier 434 which is situated above dielectric 430 may be removed during this step, or it can be removed in a subsequent step.

The embodiment of the instant invention illustrated in FIGS. 5 and 6a–6d preferably utilizes a metal structure which is comprised of aluminum or aluminum doped with a smaller amount of copper (preferably on the order of 0.5 to 2 wt %; hence, a conductive structure which is not substantially sensitive to an oxygen ambient. While Cu doping of Al improves the electromigration resistance of the interconnect, pure copper structures and aluminum structures with greater than 5% copper doping are difficult to etch. The instant invention would work for such structures, in addition to pure Cu structures, if they could be etched.

Figures 5, 6A:
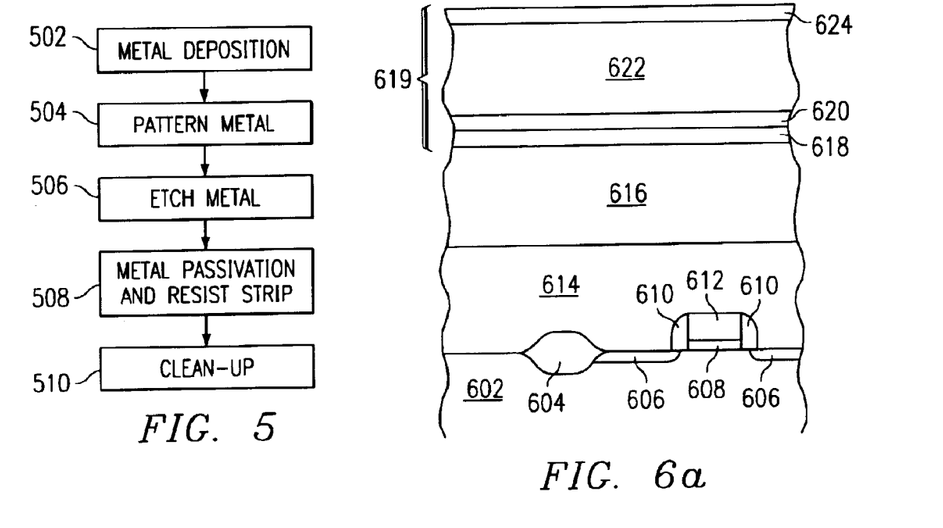
FIG. 5 is a flow diagram illustrating the method of another embodiment of the instant invention. This method of the instant invention is preferably utilized in a non-damascene process flow where any exposed (metal) structures may or may not be oxygen-sensitive.
FIGS. 6a–6d are cross-sectional views of a semiconductor device which is fabricated using the method of the instant invention (which is illustrated in FIG. 5) incorporated into a non-damascene process, such as that used for Al metallization, for example.

Referring to step 502 of FIG. 5 and FIG. 6a, conductive stack 619 is formed above dielectric layers 616 and 614 (which may be formed in a single layer). Preferably, dielectric layers 614 and 616 are comprised of the same material which may include: BPSG, PSG, HSQ, silicon oxide, TEOS, or a low dielectric constant material (such as aerogel, xerogel, or a low-k polymer such as fluorinated parylene). An underlying structure may include: isolation region 604 (which may be comprised of a shallow trench isolation structure, a field oxide region, or a LOCOS region); source/drain regions 606 formed in substrate 602, and a gate structure (comprised of conductive structure 612, sidewall insulators 610, and gate dielectric 608). Layers 614, 616 and the stack 619 can also be deposited on additional metal layers, while the different metal lines are connected by conducting vias. While FIGS. 6a–6d depict the first metal layer, this invention is applicable to any metal level.

Preferably, conductive stack 619 is comprised of titanium containing layer 618, titanium nitride containing layer 620, conductor 622, and an antireflective coating (ARC) 624. Preferably, conductor 622 is comprised of aluminum or copper-doped aluminum (where there is 0.5 to 2.5 wt % of copper), and ARC layer 624 is comprised of TiN, and optionally, an inorganic layer (such as $SiO_xN_y$) or organic layer on top of the TiN layer. While layers 618, 620, and 624 are described herein to contain titanium or titanium nitride, these exact compositions are not necessary, they are merely the best choices for adhesion and barrier properties using present processing technologies. It should be obvious to one of ordinary skill in the art to use other combinations of materials.

Figure 6B:
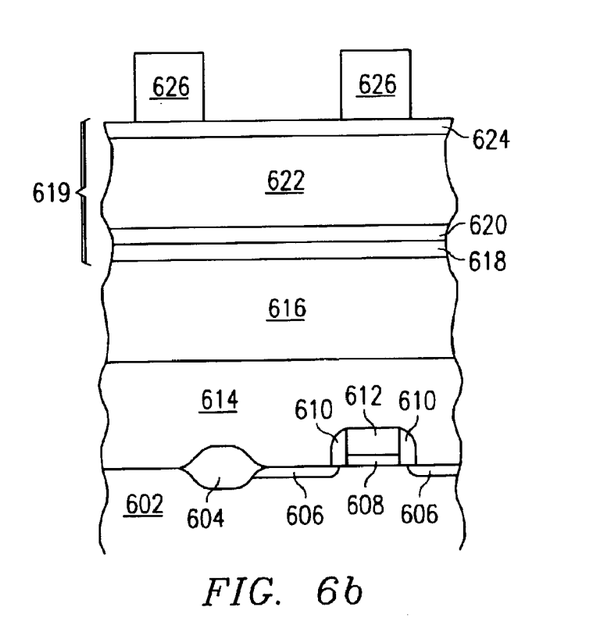
Figure 6C:
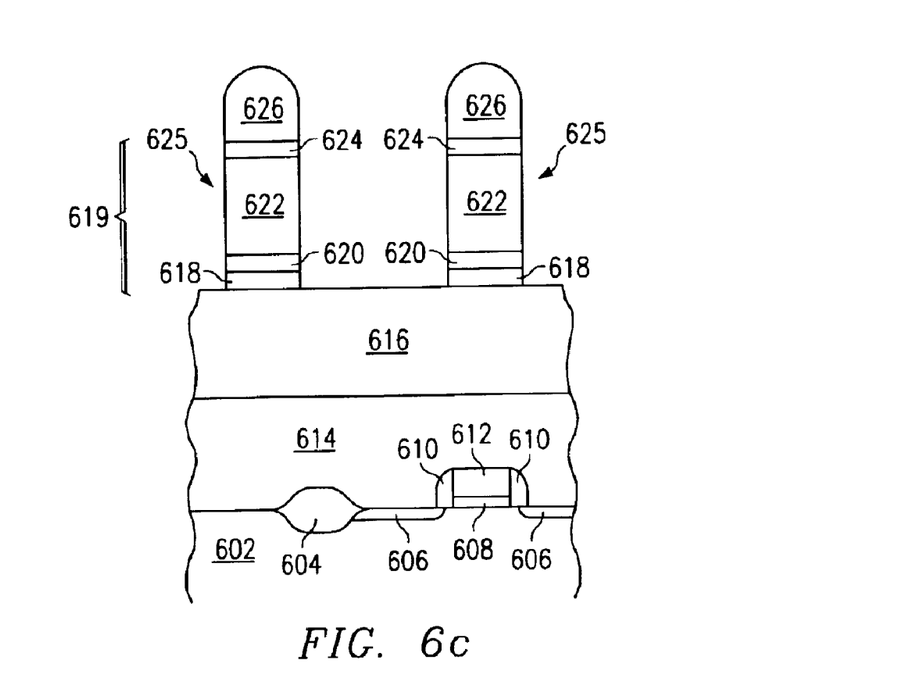

Referring to step 504 of FIG. 5 and FIG. 6b, a patterned photoresist layer 626 is formed on ARC layer 624 by a sequence typically consisting of photoresist coating, lithographic patterning and developing, so as to provide a pattern for a subsequent conductor patterning step. Referring to step 506 of FIG. 5 and FIG. 6c, conductive stack 619 is patterned using photoresist layer 626 as a pattern mask. Preferably, step 506 is accomplished by a commercial metal etch reactor, such as an Applied Materials DPS reactor or a Lam Research Corporation TCP 9600 plasma reactor. In the case that an additional inorganic (such as $SiO_xN_y$) or organic layer is used on top of the TiN ARC layer, this layer has to be opened prior to etching the conductive stack. Other than patterning conductive stack 619, the result of this step is to erode portions of photoresist layer 626 which forms a polymeric residue on conductors 625 and on the exposed portions of dielectric layer 616. The remaining photoresist and the residue must be removed.

Figure 6D:
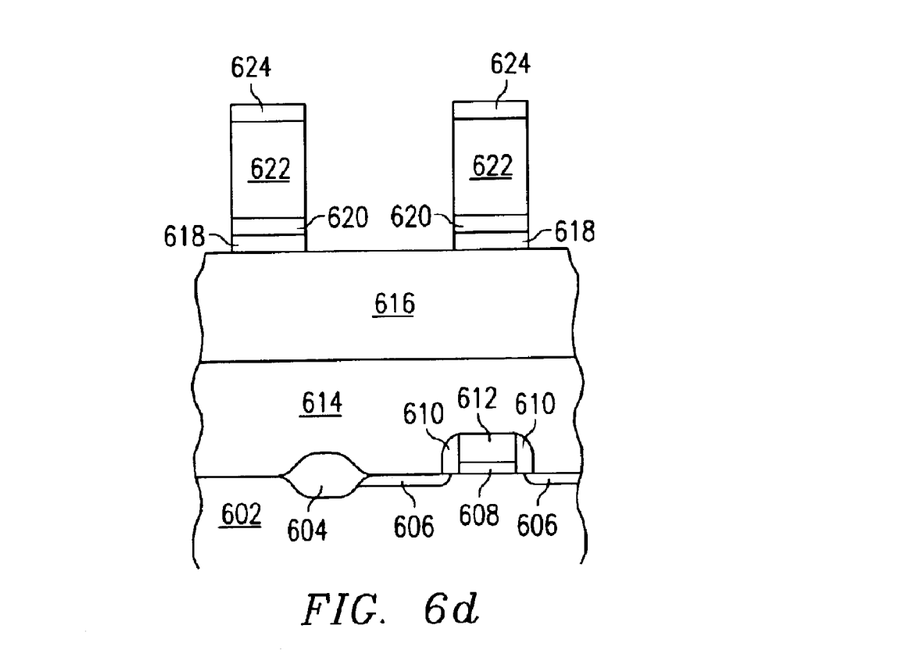

Referring to steps 508 and 510 of FIG. 5 and FIG. 6d, photoresist 626 is removed next. Traditionally, photoresist 626 was removed by subjecting the wafer to an oxygen-containing ambient at an elevated temperature. In addition, an $H_2O$-containing plasma has to be used to convert aluminum halide, which is the main etch byproduct and is the cause of aluminum corrosion if left on the etched surface, into volatile hydrogen halide. This may not be applicable in some processing chambers and it may cause problems if conductor 622 is comprised of an oxygen-sensitive material. In addition, if the traditional method is utilized, a subsequent clean-up step must be performed so as to remove any residue formed on the conductive structure. This clean-up step may utilize a solvent (wet) clean or it may utilize the (dry) clean-up step of the instant invention.

The method of the instant invention can be used to remove the photoresist, clean any residue, including aluminum halide, formed on the conductive structures and on the dielectric, and to passivate the conductive structure. Preferably, the method of the instant invention is comprised of subjecting the wafer to a hydrogen-containing or deuterium-containing plasma (preferably a remotely generated plasma) at an ambient temperature around 150 to 350° C. (more preferably around 200 to 260° C.—even more preferably around 240 to 250° C.). Alternatively, a multiple step ash and clean process may be used which includes both the $H_2$ or hydrogen-containing plasma and the conventional $H_2O/O_2$ plasma processes. In an alternative embodiment, the residue removal step of the instant invention is performed prior to the removal of the photoresist (where accomplished using the method of the instant invention or not).

While the embodiments of the instant invention are described above with regards to removing residue from metallic structures, the instant invention is equally applicable to removing residue from the sidewalls and other exposed portions of the dielectric layer. More specifically, residue, which is produced by the reaction of the photoresist with the fluorine-containing chemistry (used to etch the openings in the dielectric layers—preferably comprising an oxide) forms both on the underlying metallic structure and on the exposed portions of the dielectric layer and is readily removed using any of the embodiments of the instant invention. Hence, when vias or openings are formed in the dielectric layers (which are covered with pattern photoresist), residues form on the sidewalls of the vias/openings in the dielectric layer and on the portion of the underlying conductor which is exposed by this newly formed via/opening in the dielectric layer. This residue can be removed by the methods of the instant invention.

Although specific embodiments of the present invention are herein described, they are not to be construed as limiting the scope of the invention. Many embodiments of the present invention will become apparent to those skilled in the art in light of the methodology of the specification. The scope of the invention is limited only by the claims appended.

What we claim is:

1. A method of forming a conductive feature comprised of a material which is not substantially sensitive to oxygen over a semiconductor substrate for an electronic device, said method comprising the steps of:

forming a conductive layer over said semiconductor substrate, said conductive layer comprised of said material which is not substantially sensitive to oxygen;

forming a photoresist layer over said conductive layer, said photoresist having a pattern so as to expose portions of said conductive layer;

removing said exposed portions of said conductive layer so as to form said conductive structure; and subjecting said semiconductor wafer to a remote plasma process which incorporates a gas which includes hydrogen or deuterium with a bias voltage of zero volts applied to the wafer to remove photoresist from said material.

2. The method of claim 1, wherein said material which is not substantially sensitive to oxygen is comprised of aluminum.

3. The method of claim 1, wherein said gas is comprised of a gas selected from the group consisting of: $H_2$, $D_2$, $NH_3$, $N_2H_2$, $H_2S$, $CH_4$, and deuterated forms of these gases.

4. The method of claim 1, wherein residue formed on exposed portions of said conductive feature are removed during said step of subjecting said semiconductor wafer to a plasma which incorporates a gas which includes hydrogen or deuterium.

5. The method of claim 1, wherein said step of subjecting said semiconductor wafer to a plasma which incorporates a gas which includes hydrogen or deuterium passivates said conductive structure.

* * * * *